United States Patent
Chang et al.

(10) Patent No.: US 9,396,903 B1
(45) Date of Patent: Jul. 19, 2016

(54) APPARATUS AND METHOD TO CONTROL ION BEAM CURRENT

(71) Applicant: Varian Semiconductor Equipment Associates, Inc., Gloucester, MA (US)

(72) Inventors: Shengwu Chang, South Hamilton, MA (US); Kristen S. Rounds, Rowley, MA (US); William Leavitt, Haverhill, MA (US); Michael St. Peter, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 7 days.

(21) Appl. No.: 14/615,602

(22) Filed: Feb. 6, 2015

(51) Int. Cl.
*C23C 14/48* (2006.01)
*G21K 1/08* (2006.01)
*H01J 37/317* (2006.01)
*H01J 37/08* (2006.01)
*H01J 37/10* (2006.01)

(52) U.S. Cl.
CPC .............. *H01J 37/08* (2013.01); *H01J 37/10* (2013.01); *H01J 37/3171* (2013.01); *H01J 2237/0473* (2013.01); *H01J 2237/0475* (2013.01)

(58) Field of Classification Search
USPC ........... 250/269.1, 281, 282, 288, 306, 491.1, 250/492.1, 492.11, 492.21, 492.2, 592.3, 250/492.23, 526
See application file for complete search history.

(56) References Cited

U.S. PATENT DOCUMENTS

| | | | | |
|---|---|---|---|---|
| 7,462,844 | B2* | 12/2008 | Chang | H01J 37/3171 250/492.21 |
| 7,531,819 | B2* | 5/2009 | DiVergilio | B08B 7/0035 134/1.1 |
| 8,110,820 | B2* | 2/2012 | Glavish | H01J 37/05 250/396 R |
| 8,952,340 | B2* | 2/2015 | Kabasawa | H01J 37/05 250/306 |
| 9,263,231 | B2* | 2/2016 | Chang | H01L 21/265 |
| 9,269,541 | B2* | 2/2016 | Inada | H01J 37/3171 |
| 2014/0326179 | A1* | 11/2014 | Todorov | C23C 14/48 118/697 |
| 2014/0352615 | A1* | 12/2014 | Kabasawa | H05H 7/04 118/712 |
| 2014/0366801 | A1* | 12/2014 | Kabasawa | H01J 37/3007 118/712 |

* cited by examiner

Primary Examiner — Bernard Souw

(57) ABSTRACT

An apparatus to control an ion beam for treating a substrate. The apparatus may include a fixed electrode configured to conduct the ion beam through a fixed electrode aperture and to apply a fixed electrode potential to the ion beam, a ground electrode assembly disposed downstream of the fixed electrode. The ground electrode assembly may include a base and a ground electrode disposed adjacent the fixed electrode and configured to conduct the ion beam through a ground electrode aperture, the ground electrode being reversibly movable along a first axis with respect to the fixed electrode between a first position and a second position, wherein a beam current of the ion beam at the substrate varies when the ground electrode moves between the first position and second position.

19 Claims, 5 Drawing Sheets

```
                    ┌─────────────────────────────┐
      400           │ GENERATE ION BEAM USING ION │
                    │          SOURCE             │
                    │            402              │
                    └──────────────┬──────────────┘
                                   │
                    ┌──────────────▼──────────────┐
                    │  ARRANGE GROUND ELECTRODE AN│
                    │  ADJUSTABLE ACCEL/DECEL     │
                    │  COLUMN AT FIRST POSITION   │
                    │            404              │
                    └──────────────┬──────────────┘
                                   │
                    ┌──────────────▼──────────────┐
                    │ APPLY FIRST FIXED ELECTRODE │
                    │ POTENTIAL TO ION BEAM AT    │
                    │ FIXED ELECTRODE OF THE      │
                    │ ADJUSTABLE ACCEL/DECEL      │
                    │ COLUMN DISPOSED ADJACENT TO │
                    │ AND UPSTREAM OF GROUND      │
                    │ ELECTRODE WHEN GROUND       │
                    │ ELECTRODE IS DISPOSED AT    │
                    │ FIRST POSITION              │
                    │            406              │
                    └──────────────┬──────────────┘
                                   │
                    ┌──────────────▼──────────────┐
                    │ APPLY SECOND FIXED ELECTRODE│
                    │ POTENTIAL LESS THAN FIRST   │
                    │ FIXED ELECTRODE POTENTIAL TO│
                    │ ION BEAM AT FIXED ELECTRODE │
                    │            408              │
                    └──────────────┬──────────────┘
                                   │
                    ┌──────────────▼──────────────┐
                    │   RECEIVE USER INPUT IN     │
                    │       DRIVE COMPONENT       │
                    │            410              │
                    └──────────────┬──────────────┘
                                   │
                    ┌──────────────▼──────────────┐
                    │ MOVE GROUND ELECTRODE TO    │
                    │ SECOND POSITION, WHEREIN    │
                    │ GROUND ELECTRODE AND FIXED  │
                    │ ELECTRODE DEFINE FIRST GAP  │
                    │ IN FIRST POSITION AND A     │
                    │ SECOND GAP IN SECOND        │
                    │ POSITION SMALLER THAN       │
                    │ FIRST GAP                   │
                    │            412              │
                    └─────────────────────────────┘
```

*FIG. 4*

APPARATUS AND METHOD TO CONTROL ION BEAM CURRENT

FIELD

The present embodiments relate to ion beam apparatus, and more particularly, to components and methods to control ion beams in beamline ion implanters.

BACKGROUND

In the present day, ion implanters are often constructed to optimize implantation according to a specific set of applications. In some applications, for example, it may be useful to increase beam current to increase throughput of substrates to be implanted. Some beamline ion implanters may be employed to implant substrates over a range of energies, such as between 1 keV and 300 keV. This capability provides flexibility for processing substrates such as silicon wafers, for example, in circumstances where the silicon wafers are scheduled for various implants at differing ion energies. In order to define an implant energy, an ion beam may be subject to acceleration and deceleration by various components in a beamline ion implanter between an ion source and substrate to be implanted.

In an ion implanter used for ion implantation over a wide range of energies, such as between 1 keV and 300 keV, it may be convenient to extract ions from an ion source at a target energy, such as 50 keV, regardless of the target ion implant energy to be imparted to ions implanted into a substrate. This practice may ensure adequate beam current is extracted from an ion source, even for low energy implantation, since the extraction current I has a dependence upon extraction voltage V, wherein I is proportional to $V^{3/2}$ in accordance with the Child-Langmuir law. Accordingly, an ion beam having an initial ion energy of, for example, 50 KeV or greater may be received by an acceleration/deceleration column (accel/decel column) configured to adjust beam potential (beam voltage) of the ion beam in order to impart a target beam energy to the ion beam. The accel/decel column may include multiple electrodes configured to adjust beam potential and shape the ion beam.

In order to ensure stable operation, the electrode separation of various electrodes in an accel/decel column may be set at a adequate distance to prevent electrical breakdown or arcing, a process tending to increase at higher voltages. Accordingly, the electrode separation between a ground electrode and focus electrode of an accel/decel column may be set to avoid arcing at a highest operating voltage for an ion implanter, such as 300 kV. This practice may result in undesirably lower current extracted for lower ion energies. It is with respect to these and other considerations the present improvements have been needed.

SUMMARY

This Summary is provided to introduce a selection of concepts in a simplified form further described below in the Detailed Description. This Summary is not intended to identify key features or essential features of the claimed subject matter, nor is it intended as an aid in determining the scope of the claimed subject matter.

In one embodiment an apparatus control an ion beam for treating a substrate may include a fixed electrode configured to conduct the ion beam through a fixed electrode aperture and to apply a fixed electrode potential to the ion beam, a ground electrode assembly disposed downstream of the fixed electrode. The ground electrode assembly may include a base and a ground electrode disposed adjacent the fixed electrode and configured to conduct the ion beam through a ground electrode aperture, the ground electrode being reversibly movable along a first axis with respect to the fixed electrode between a first position and a second position, wherein a beam current of the ion beam at the substrate varies when the ground electrode moves between the first position and second position.

In another embodiment, an ion implanter may include an ion source to generate an ion beam for treating a substrate, an extraction electrode to extract the ion beam at an initial beam potential, and an adjustable accel/decel column configured to receive the ion beam and to adjust the initial beam potential. The adjustable accel/decel column may include a focus electrode configured to conduct the ion beam through a focus aperture and to apply a focus electrode potential to the ion beam, and a ground electrode assembly disposed downstream of the focus electrode. The ground electrode assembly may include a base and a ground electrode configured to apply a ground electrode potential different than the focus electrode potential and configured to conduct the ion beam through a ground electrode aperture, the ground electrode being reversibly movable along a first axis with respect to the focus electrode between a first position and a second position, wherein a beam current of the ion beam at the substrate varies when the ground electrode moves between the first position and second position.

In a further embodiment a method of manipulating an ion beam may include generating the ion beam using an ion source; arranging a ground electrode of an adjustable accel/decel column at a first position; applying a first fixed electrode potential to the ion beam at a fixed electrode of the adjustable accel/decel column disposed adjacent to and upstream of the ground electrode when the ground electrode is disposed at the first position; applying a second fixed electrode potential less than the first fixed electrode potential to the ion beam at the fixed electrode; and, responsive to user input in a drive component, moving the ground electrode to a second position, wherein the ground electrode and fixed electrode define a first spacing in the first position and a second spacing smaller than the first spacing in the second position.

BRIEF DESCRIPTION OF THE DRAWINGS

FIG. 4 depicts an exemplary process flow.

DETAILED DESCRIPTION

Figure 1:
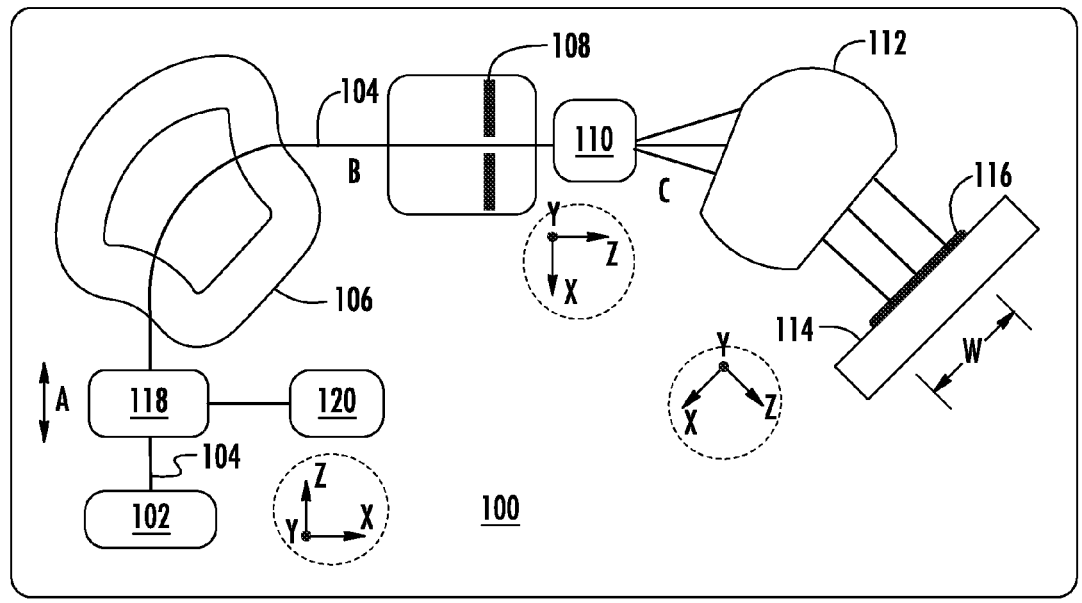
FIG. 1 depicts a top plan view in block form of a ion implanter according to various embodiments.

The present embodiments will now be described more fully hereinafter with reference to the accompanying drawings, where some embodiments are shown. The subject matter of the present disclosure, nonetheless, may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein provide novel ion implanters, and novel apparatus and an adjustable acceleration/deceleration column, also referred to herein as an "accel/decel column," is provided in a beamline ion implanter to adjust ion beam current provided to a substrate. The term "accel/decel column" as used herein refers to a component having a plurality of electrodes configured to transmit an ion beam and to apply a potential to the ion beam. The applied potential may result in increasing or decreasing the potential (voltage) of the ion beam with respect to a reference, such as ground. An accel/decel column may thus function to accelerate or decelerate an ion beam after the ion beam is extracted from an ion source to a target energy, such as a target implant energy. An accel/decel column may also function to provide a targeted beam optics over a range of ion energies and beam currents of an ion beam. Thus, an accel/decel column may operate to output an ion beam having a targeted shape, size, collimation, convergence or divergence, where the targeted entity does not vary with beam ion energy or beam current or remains within an acceptable range.

Regarding the present embodiments, the term "adjustable accel/decel column" refers to an accel/decel column having an electrode movable with respect to another electrode of the accel/decel column via operation of a drive component, including a motor, pneumatic component, or other component. The adjustable accel/decel column of the present embodiments may provide various advantages as described below. For example, a first advantageous effect involves increasing the available beam current provided to a substrate over a range of ion energies, a second advantageous effect involves providing a convenient approach to adjusting electrode separation in an accel/decel column, while a third advantageous effect involves the ability to optimize beam optics of an accel/decel column for operation over a range of ion energies and beam currents.

FIG. 1 depicts a top plan view in block form of a beamline ion implanter, shown as the ion implanter 100, in accordance with various embodiments of the disclosure. The ion implanter 100 includes an ion source 102 configured to generate an ion beam 104. The ion beam 104 may be provided as a spot beam or a ribbon beam having a cross-section where a beam width (along the X-direction of the Cartesian coordinate shown) is greater than the beam height (along the Y-direction). In the convention used herein, the Z-direction refers to a direction of an axis parallel to the central ray trajectory of an ion beam 104. Thus, the absolute direction of the Z-direction, as well as the X-direction, where the X-direction lies perpendicular to the Z-direction, may vary at different points within the ion implanter 100 as shown. The ion beam 104 may travel through an analyzer magnet 106, mass resolving slit 108, and through a collimator 112 before impacting a substrate 116 disposed on substrate stage 114. The substrate stage 114 may be configured to scan the substrate 116 at least along the Y-direction in some embodiments. In the example shown in FIG. 1, the ion beam 104 may be provided as a spot beam scanned by the scanner 110 along the X-direction, in order to provide a scanned ion beam having a width comparable to the width W of the substrate 116. In other embodiments, the ion beam 104 may be provided as a ribbon beam and the scanner 110 may be omitted. In the example of FIG. 1, other beamline components useful for operation of the ion implanter 100 are omitted for clarity as will be apparent to those of ordinary skill in the art.

The ion implanter 100 further includes an adjustable accel/decel column 118 described in detail below. As shown in FIG. 1, the adjustable accel/decel column 118 may be disposed at the point A between the ion source 102 and analyzer magnet 106. In other embodiments, the adjustable accel/decel column 118 may be disposed at other locations within the ion implanter 100, such as point B or point C. The adjustable accel/decel column 118 is coupled to a drive system 120. The drive system 120 may adjust the position of an electrode within the adjustable accel/decel column 118 with respect to other electrode(s). This adjustability allows, among other things, the beam current in the ion beam 104 to be adjusted at a given ion energy of the ion beam 104, as discussed below.

In various embodiments, the ion implanter 100 may be configured to deliver ion beams for "low" energy or "medium" energy ion implantation, including a voltage range of 1 kV to 300 kV, corresponding to an implant energy range of 1 keV to 300 keV for singly charged ions. As discussed below, the position of an electrode such as a ground electrode in the adjustable accel/decel column 118 may be adjusted depending upon the target voltage for ion implantation for ion beam 104, as well as the target beam current of ion beam 104.

Figure 2:
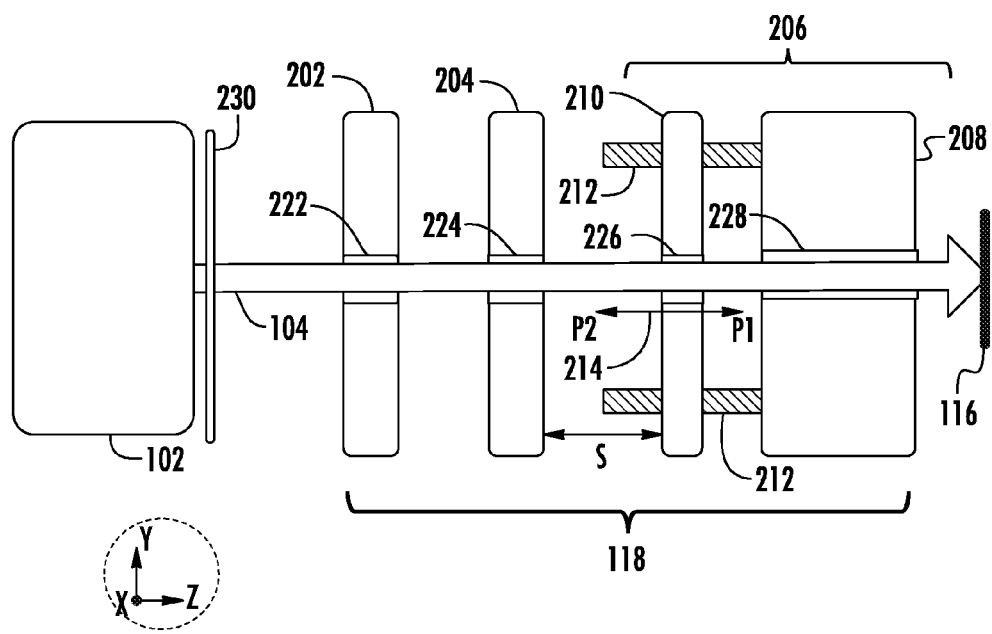
FIG. 2 depicts a side view of an exemplary apparatus to control an ion beam.

FIG. 2 depicts a side view of a variant of the adjustable accel/decel column 118 according to various embodiments. In this embodiment, the adjustable accel/decel column 118 includes a terminal electrode 202, focus electrode 204, and ground electrode assembly 206. In some embodiments, the adjustable accel/decel column 118 may include additional electrodes (not shown) such as a suppression electrode, as known in the art. The terminal electrode 202 may include a terminal electrode aperture, shown as the aperture 222, in order to conduct the ion beam 104 toward a substrate (see substrate 116 of FIG. 1). The focus electrode 204 is disposed downstream of the terminal electrode 202 and includes an aperture 224 configured to receive the ion beam 104 from the terminal electrode 202 and transmit the ion beam 104 toward the ground electrode assembly 206. The term "downstream" as used herein refers to a position of a component positioned relatively closer to a substrate along a beam path of an ion beam with respect to another component. Likewise, the term "upstream" as used herein refers to a position of a component located relatively closer to the ion source along a beam path of an ion beam with respect to another component. The ground electrode assembly 206 is disposed downstream of the focus electrode 204 and includes a base 208 and ground electrode 210. The base includes an aperture 228 and the ground electrode includes an aperture 226. These apertures are configured to conduct the ion beam 104 towards the substrate 116. In this regard, the position of the substrate 116 may differ from the position shown in FIG. 2, such as shown in FIG. 1. Details of the operation of the ground electrode assembly 206 are discussed below.

In one example of operation of the adjustable accel/decel column 118, the ion beam 104 may be extracted from ion source 102 using an extraction electrode 230 at a target extraction voltage, such as 50 kV. This voltage may provide an adequate extracted beam current for the ion beam 104 immediately adjacent the ion source 102 in order to deliver a target beam current or beam dose to the substrate 116. The adjustable accel/decel column 118 may adjust the initial beam potential of ion beam 104 generated by the extraction electrode 230 by changing the voltage (potential) of the extracted ion beam in order to impart a target energy to the ion beam 104 for implantation. In the case where an initial (extracted) beam potential of ion beam 104 is 50 kV, and the target implant energy for ion beam 104 is 250 kV, the following potentials may be set at different components. The body of the ion source 102 may be set at +250 kV, while the extraction electrode 230 used to extract the ion beam 104 from the ion source 102 is set +200 kV. The terminal electrode 202 may, but need not, be set at +200 kV. The ground electrode 210 as well as substrate 116 may be set at ground potential (0V), while the focus electrode may set at an intermediate voltage, such as +100 kV. Thus, as the ion beam 104 traverses the adjustable accel/decel column 118, the ion beam 104, when comprising positive ions, may be accelerated from an initial beam potential of +200 V to a beam potential of 0 V, resulting in an increase in ion energy from 50 keV to 250 KeV for singly charged ions. In this example, regardless of any further deceleration performed by other beamline components (not shown) between the ground electrode 210 and the substrate 116, the final energy of ion beam 104 at the substrate 116 is 250 keV, since the ground electrode 210 and substrate 116 are at the same potential.

A separate power supply (not shown) may be coupled to the ion source 102, extraction electrode 230, terminal electrode 202, and focus electrode 204 in order to provide a targeted voltage (potential) independently to the different components. Moreover, the base 208 and ground electrode 210 of the ground electrode assembly 206 may be maintained at ground potential.

As further shown in FIG. 2, the ground electrode 210. is disposed adjacent the focus electrode 204, meaning there are no other electrodes between the focus electrode 204 and ground electrode 210. As noted, one function of the focus electrode 204 may be to treat the ion beam 104 to shape the beam in a targeted manner. The focus electrode 204 may help maintain a target shape, size, beam emittance, collimation, divergence, or convergence of the ion beam. Between the focus electrode 204 and ground electrode 210, an electric field is produced where the field strength may be varied according to the difference in potential applied to the ground electrode 210 and focus electrode 204. In the above example, a potential difference of 100 kV (+100 kV on focus electrode and 0V on ground electrode 210) may produce a strong electric field between the ground electrode 210 and the focus electrode 204.

In order to avoid arcing or other breakdown of the adjustable accel/decel column 118 resulting from an excessive electric field, it may be useful to set the gap or spacing S between the ground electrode 210 and focus electrode 204 at a relatively larger distance. In accordance with the present embodiments, the ground electrode assembly 206 is configured so the ground electrode 210 is reversibly movable with respect to the base 208, and thus movable with respect to the focus electrode 204. The focus electrode may accordingly be deemed a fixed electrode. As shown in FIG. 2, the ground electrode 210 may be movable with the aid of support members 212 along the axis 214, where the axis 214 lies parallel to the Z-axis as shown. In different embodiments, the ground electrode 210 may be movable between endpoints characterized by a first position P1 and a second position P2. In some embodiments, the ground electrode 210 may be movable between discrete positions, such as a series of two, three, or four positions including P1 and P2. The embodiments are not limited in this context. In other embodiments, the ground electrode 210 may be continuously movable over a range of positions between endpoints represented by a first position P1 and second position P2. In other words, the position of ground electrode may be moved to any set position between P1 position and P2, and may stably remain and operate at the set position.

In various embodiments, the ground electrode 210 may be movable along the axis 214 over a range spanning 100 mm. In other embodiments the ground electrode 210 may be movable along the axis 214 over a range spanning 150 mm. The embodiments are not limited in this context. In particular embodiments, the ground electrode 210 may be movable with respect to a fixed electrode such as focus electrode 204. In this manner, the ground electrode 210 may be separated from the focus electrode 204 along the axis 214 by a first spacing s greater than 100 mm when the ground electrode 210 is disposed in a first position P1 (first endpoint) and may be separated from the focus electrode 204 by a second spacing less than 30 mm when the ground electrode 210 is disposed in the second position P2 (second endpoint). The ability to move the ground electrode 210 with respect to the focus electrode provides multiple advantages as detailed below.

The movement of the ground electrode 210 may be controlled by the drive system 120 discussed earlier. The drive system 120 may include a user interface (not shown) to receive a user selection of parameters such as a position of ground electrode 210, voltage applied to focus electrode 204, or other parameters. The drive system 120 may also include a component or components to adjust the position of the ground electrode 210. In one example, a drive motor or drive motors (not shown) may be provided to move the ground electrode 210 with respect to the base 208 and with respect to the focus electrode 204. The drive motor may be configured to continuously vary position of the ground electrode 210 continuously between P1 and P2. In another example, a pneumatic system (not shown) may be coupled to the ground electrode 210, so the pneumatic system may place the ground electrode 210 is a series of discrete positions including P1 and P2.

Returning to the example where the potential at terminal electrode 202 is 200 kV, and the potential at focus electrode 204 is 100 kV, it may be useful to place the ground electrode 210 at or near the position P1, resulting in a spacing S of 150 mm in one example. In this manner, since the electric field (E) extending between the ground electrode 210 and focus electrode 204 is proportional to $\Delta V/S$, ($\Delta V=100$ kV$-0$ kV$=100$ kV in this example) the electric field E may be maintained at an acceptable level for avoiding arcing or breakdown. For a given ion source condition of ion source 102, a given extraction potential applied to the extraction electrode 230, terminal electrode potential applied to terminal electrode 202, and a given focus electrode potential applied to focus electrode 204, the beam current transmitted by the adjustable accel/decel column 118 may decrease for an increase in S. Accordingly, in some embodiments of the disclosure, the target value of S may be empirically determined based upon a tradeoff between increased beam current for lower values of S and increased reliability at higher values of S.

In conventional accel/decel column structures where the electrodes are stationary with respect to one another, when an accel/decel column is designed the separation between electrodes may be set to ensure reliable operation at the highest operating implant voltage, including, for example, the neighborhood of 300 kV. In such conventional accel/decel column hardware, the value of S, being fixed, may be relatively larger, such as 100 mm to 150 mm. In contrast, when operating at lower implantation voltages, such as 20 kV, a separation S of 150 mm may be unnecessarily large, since the voltage difference between focus electrode and ground electrode in such a circumstances may be on the order of 10 kV. At a voltage difference of 10 kV between ground electrode and focus electrode, arcing may not occur at distances greater than 20 mm or so. Accordingly, in such a fixed electrode configuration of an accel/decel column, the beam current transported through the accel/decel column may be unnecessarily reduced by the unnecessarily large value of the separation S.

An advantage afforded by the present embodiments includes the ability to tailor the separation S in accordance with ion implantation energy and beam current of the ion beam 104 received by the adjustable accel/decel column 118. Accordingly, for relatively higher implant energies, such as 175 keV to 300 keV, the position of the ground electrode 210 may be adjusted closer to the position P1, so the spacing S may has a relatively larger value, e.g., between 100 mm to 150 mm. The embodiments are not limited in this context. For intermediate energies such as between 70 keV and 160 keV, the position of the ground electrode 210 may be moved closer to the position P2, where the spacing S ranges between 50 mm and 100 mm. This practice may allow the electric field strength in the gap between the focus electrode 204 and the ground electrode 210 to be set at a maximum value where electric breakdown is not caused, in order to improve focus of the ion beam 104. This maximum value may maximize the beam current of ion beam 104 output to the substrate 116 while avoiding risking arcing or other electrical breakdown in the adjustable accel/decel column 118. The embodiments are not limited in this context.

For relatively lower implant energies, such as 2 kV to 30 kV, the spacing S may be maintained at a relatively smaller value, such as between 20 mm to 50 mm. Again, with this relatively smaller spacing S the amount of beam current output to the substrate 116 may be increased in relation to larger values of S, while avoiding the risk of breakdown. The embodiments are not limited in this context.

The present inventors have investigated the effects of varying separation S on the beam current delivered by an adjustable accel/decel column arranged according to embodiments of the present disclosure.

In one series of experiments a boron (B+) ion beam of 5 keV energy was delivered to a substrate in an ion implanter where the position of a ground electrode was moved from a large separation S of 102 mm, characteristic of a conventional accel/decel column, to an intermediate separation of 63 mm, and to a small separation of 24 mm. At the large separation a 0.82 mA was delivered at the substrate at a region of interest (ROI). At intermediate separation, a beam current at ROI was 1.31 mA, while at the small separation, the beam current at ROI was 1.54 mA. Accordingly, by adjusting the position of the ground electrode to be closer to the focus electrode than in conventional apparatus, the 5 keV B+ beam current increased 88%, from 0.82 mA to 1.54 mA.

In additional investigations, model-based simulation was performed using a 70 keV As+ beam transported through an acceleration/deceleration column, for different ground electrode positions with respect to a focus electrode. In the case of a large separation of 102 mm, the beam current of a 70 keV As+ beam transported through the beam-line was 18 mA, while in the case of a small separation of 51 mm the beam current of a 70 keV As+ beam transported through the beam-line was 26 mA.

The beam current delivered to a substrate may thus be maximized by minimizing the spacing S between ground electrode and focus electrode. The target spacing S for a given ion beam may be set in consideration of additional factors beyond the consideration of maximizing beam current. For example, with reference again to FIG. 1 and FIG. 2, when an ion implanter 100 is operated for low energy beams in the 2 keV to 40 keV energy range, the position of the ground electrode 210 may be adjusted within the range between position P1 and position P2 to an optimal position so the ion beam 104 has minimum emittance before entering analyzer magnet 106.

Figure 3A:
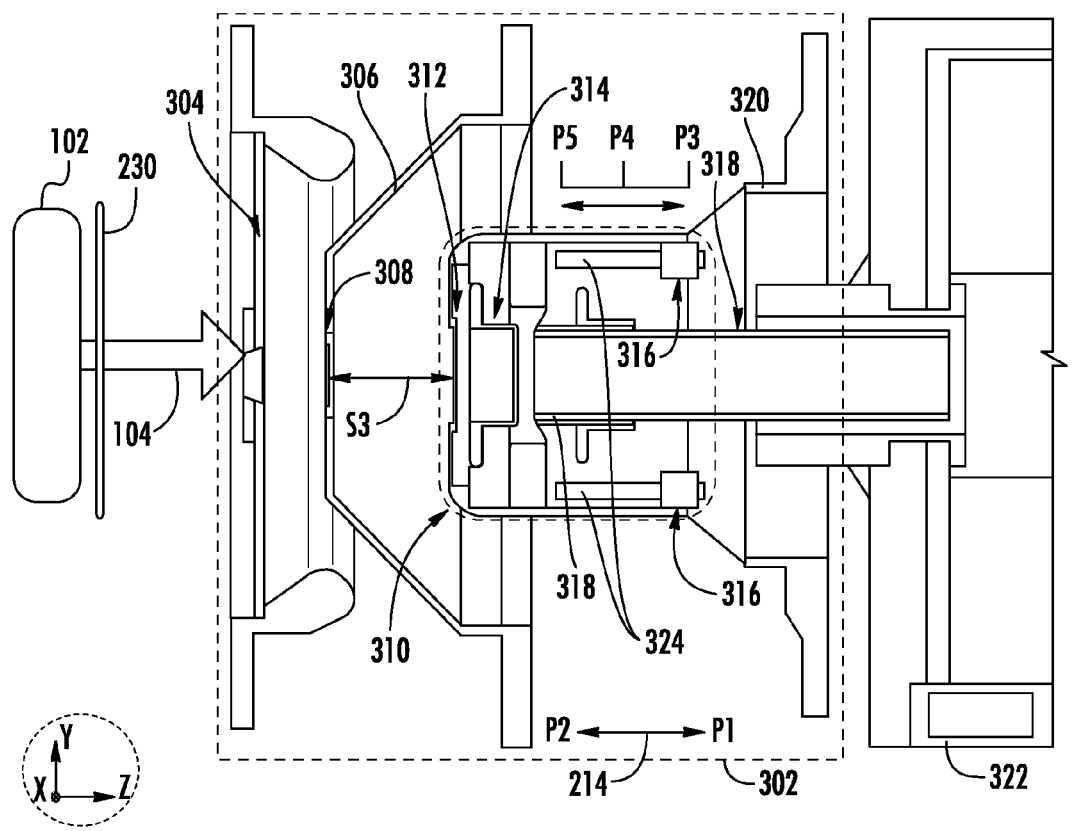
FIG. 3A-3C depict operation of an exemplary apparatus according to additional embodiments of the disclosure.
Figure 3B:
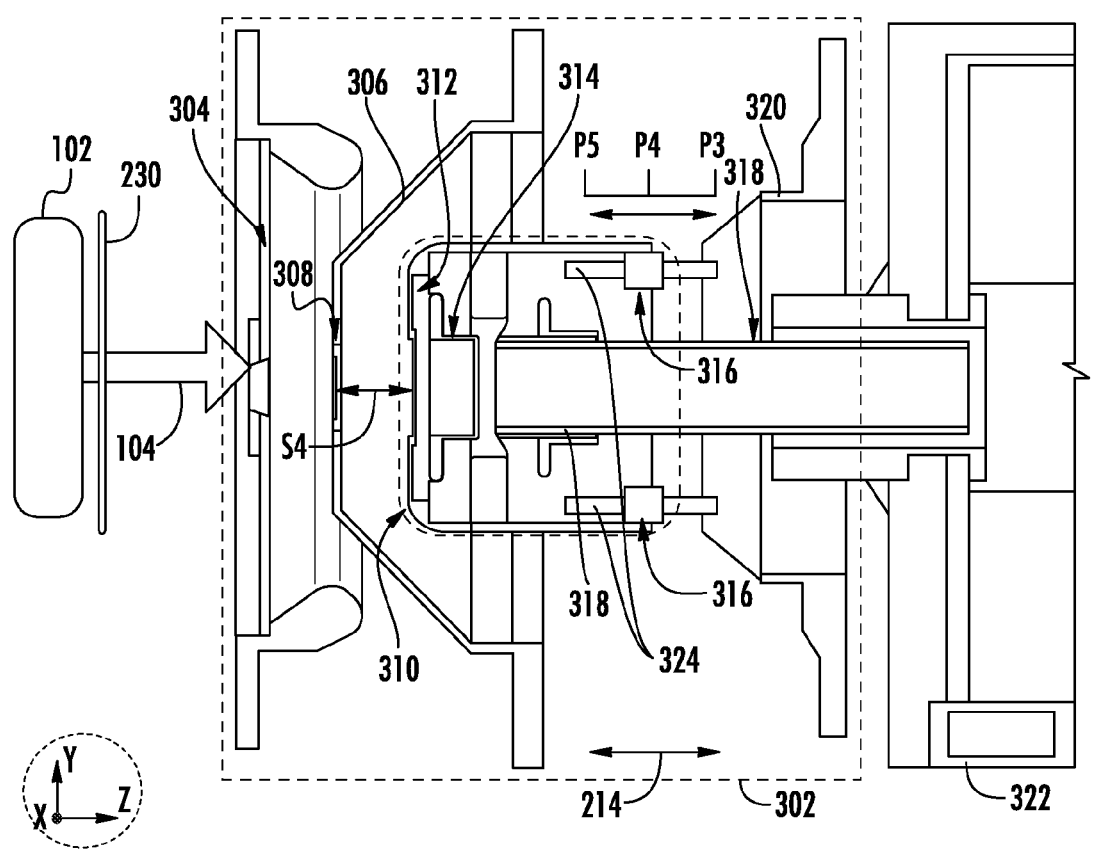
Figure 3C:
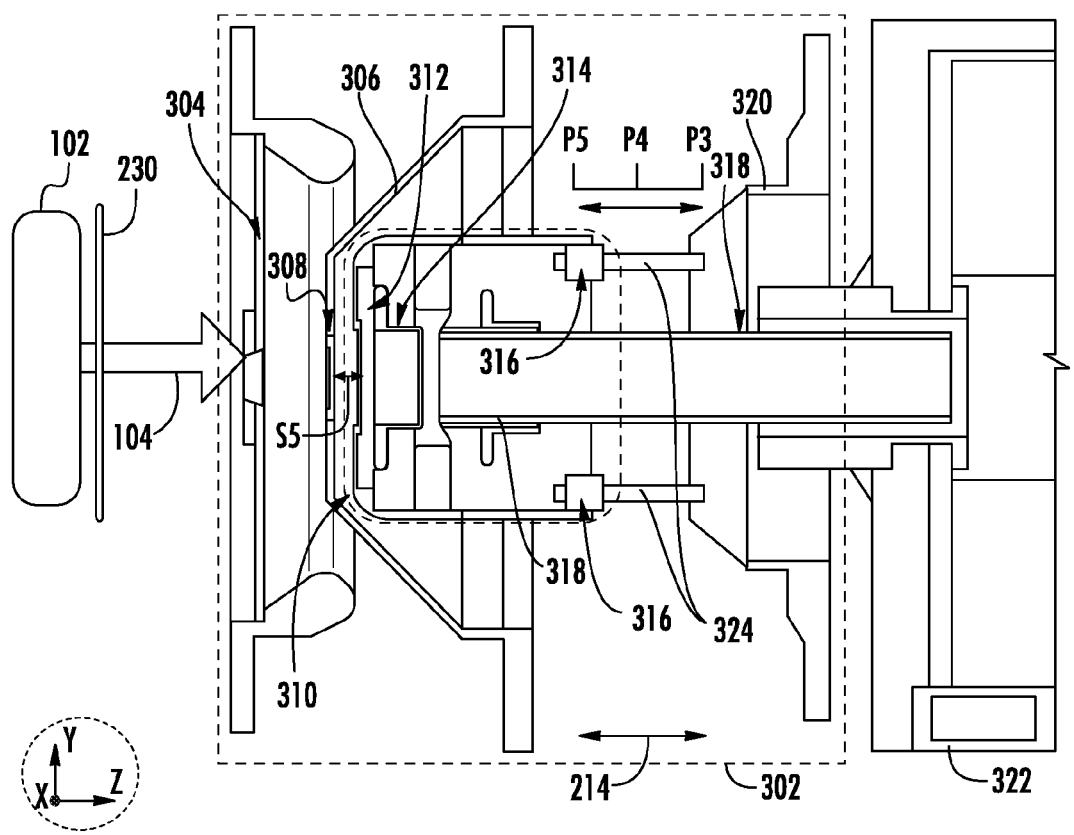

In various additional embodiments, an accel/decel column may include additional components to those illustrated in FIG. 2. FIG. 3A, FIG. 3B, and FIG. 3C illustrate operation of an accel/decel column 302 according to additional embodiments of the disclosure. The accel/decel column 302 includes a terminal electrode 304, focus electrode 306, ground electrode 310, suppression electrode 314, tube lens 318 and base 320. The ground electrode 310 and base 320 may form part of a ground electrode assembly set at ground potential. The suppression electrode 314 may include a suppression electrode aperture (not separately shown). The suppression electrode 314 and tube lens 318 may be biased with a potential negative with respect to ground in some examples. Also shown in FIG. 3A, FIG. 3B, and FIG. 3C is a focus electrode aperture 308, ground electrode aperture 312, and an analyzer magnet 322. As illustrated, the ion beam 104 is generally conducted from left to right in the figures. During the transit the ion beam 104 is extracted from the ion source 102 and processed by the accel/decel column 302 before entering the analyzer magnet 322.

As shown in the figures, the accel/decel column 302 also includes a plurality of support members, shown as support members 324, and being affixed to the base 320. The ground electrode 310 may be reversibly movable with respect to the base 320 with the aid of support members 324. In some embodiments motor drives may be provided to move the ground electrode 310 along the axis 214 with respect to the base 320. The ground electrode 310 may also comprise a plurality of sleeves, shown as sleeves 316. The sleeves 316 may be attached to the ground electrode 310 and circumferentially disposed around the support members 324, respectively. The sleeves 316 may be slidably movable with respect to the support members 324 along the axis 214. In the examples of FIG. 3A, FIG. 3B, and FIG. 3C, the sleeves 316 are disposed at the position P3, position P4, and position P5, respectively. As illustrated, at the position P3 the ground electrode 310 may abut against the base 320, while at position P5, the ground electrode may extend at a furthest distance from the base 320. On the other hand, at the position P3, the spacing S3 along the axis 214 between the ground electrode 310 and focus electrode 306 is a maximum, the spacing S4 at the position P4 is an intermediate value, while the spacing S5 at the position P5 is a minimum.

As further shown in FIGS. 3A-3C, the suppression electrode 314 may be disposed within the ground electrode 310 and may be coupled to the ground electrode 310 so the suppression electrode 314 moves in concert with the ground electrode 310. The suppression electrode 314 may be configured to apply a suppression electrode potential in a range of −3 kV to −10 kV to the ion beam 104 to suppress electrons for preventing radiation.

As also depicted in FIGS. 3A-3C, the tube lens 318 includes two parts including a first portion fixed in position (shown as a right portion in FIGS. 3A-3C). The tube lens 318 also includes a second portion (shown in FIGS. 3A-3C as a left portion) disposed around the first portion and coupled to the ground electrode 310. Thus, the left portion of the tube lens 318 is not affixed to the right portion of the tube lens 318 so the left portion is slidably movable with respect to the right portion. In particular, the left portion of the tube lens 318 may move in concert with movement of the ground electrode 310 while the right portion remains fixed, so the length of the tube lens 318 may be adjusted. The tube lens 318 may be configured to apply a tube lens potential in a range of −3 kV to −40 kV to the ion beam 104 when the ion beam 104 passes through the tube lens 318 and has an energy in a range of 2 keV to 40 keV in order to shape the ion beam 104. When beam energy of the ion beam 104 is above 40 keV, the tube lens 318 may be configured to apply a ground potential to the ion beam 104.

In the aforementioned embodiments, the position of a movable electrode such as a ground electrode may be adjusted in response to user input in a drive system including any convenient user interface, such as a keyboard, keypad, touchscreen, or other device. Moreover, the position of a ground electrode may be controlled in different ways according to different embodiments. For example, in some implementations, a user may explicitly select a ground electrode position at a user interface. In this manner, a user may specify a target ground electrode position to be employed, and thus adjust the ground electrode position by entering a position value causing the drive system to move the ground electrode to the specified position.

Alternatively, an ion implanter may be pre-calibrated to allow a corresponding ground electrode position to be predetermined for a given implant energy corresponding to a final beam voltage. In this implementation, a user may be provided merely with a selection of voltages to be applied to one or more components of the ion implanter, such as the implant voltage, terminal electrode voltage, focus electrode voltage, and so forth. Once a voltage parameter(s) is specified, the drive component may be configured to automatically move the ground electrode to a first predetermined position. When voltage is subsequently adjusted, the drive component may be configured to automatically move the ground electrode from the first predetermined position to a second predetermined position FIG. 4 depicts exemplary operations involved in a method according to embodiments of the disclosure. At block 402, an ion beam is generated using an ion source. The ion beam may be extracted at an extraction voltage adequate to produce a target initial beam current. At block 404, a ground electrode of an adjustable accel/decel column is arranged at a first position. At block 406, when the ground electrode is disposed at the first position, a first fixed electrode potential is applied to the ion beam by a fixed electrode of the adjustable accel/decel column disposed upstream of and adjacent to the ground electrode. The fixed electrode may be a focus electrode in various embodiments. At block 408, a second fixed electrode potential is applied to the ion beam by the fixed electrode, where the second fixed electrode potential is less than the first fixed electrode potential. At block 410, user input is received at in a drive component. The user input may be a selection of a position for the ground electrode. At block 412, the ground electrode is moved to a second position wherein the ground electrode and fixed electrode define a first gap in the first position and a second gap in the second position smaller than the first gap.

In summary, the adjustable accel/decel column of the present embodiments may provide various advantages. For example, a first advantageous effect involves increasing the available beam current provided to a substrate over a range of ion energies, a second advantageous effect involves providing a convenient approach to adjusting electrode separation in an accel/decel column, while a third advantageous effect involves the ability to optimize beam optics of an accel/decel column for operation over a range of ion energies and beam currents.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus to control an ion beam for treating a substrate, comprising:
   a fixed electrode configured to conduct the ion beam through a fixed electrode aperture and to apply a fixed electrode potential to the ion beam;
   a ground electrode assembly disposed downstream of the fixed electrode, the ground electrode assembly comprising:
   a base; and
   a ground electrode disposed adjacent the fixed electrode and configured to conduct the ion beam through a ground electrode aperture, the ground electrode being reversibly movable along a first axis with respect to the fixed electrode between a first position and a second position, wherein a beam current of the ion beam at the substrate varies when the ground electrode moves between the first position and second position.

2. The apparatus of claim 1, further comprising a drive component configured to move the ground electrode between the first position and second position responsive to user input.

3. The apparatus of claim 1, further comprising a plurality of support members affixed to the base, wherein the ground electrode further comprises a plurality of sleeves circumferentially disposed around the plurality of support members, respectively, wherein the plurality of sleeves are slidably movable with respect to the plurality of support members along the first axis.

4. The apparatus of claim 1, wherein the fixed electrode is a focus electrode configured to shape the ion beam, the apparatus further comprising:
   a terminal electrode disposed upstream of the focus electrode, configured to conduct the ion beam through a terminal electrode aperture and to apply a terminal electrode potential to the ion beam;
   a suppression electrode having a suppression electrode aperture disposed downstream of the ground electrode aperture, the suppression electrode configured to apply a suppression electrode potential to the ion beam to suppress electrons for preventing radiation; and
   a tube lens disposed at least partially within the ground electrode assembly and configured to apply a tube lens potential to the ion beam.

5. The apparatus of claim 4, wherein the tube lens comprises a first portion and a second portion disposed around the first portion and slidably movable with respect to the first portion along the first axis.

6. The apparatus of claim 4, wherein the suppression electrode potential ranges from −3 kV to −10 kV, and wherein the suppression electrode is movable with respect to the focus electrode along the first axis.

7. The apparatus of claim 1, wherein the ground electrode is movable between discrete positions including the first position and second position.

8. The apparatus of claim 1, wherein the ground electrode is continuously movable between the first position and second position.

9. The apparatus of claim 4, wherein the terminal electrode, fixed electrode and ground electrode assembly comprise an accel/decel column configured to adjust the ion beam to a potential of up to 300 kV with respect to ground.

10. The apparatus of claim 4, wherein the ground electrode is movable along the first axis with respect to the focus electrode over a distance spanning a range of 100 mm to 150 mm.

11. The apparatus of claim 1, wherein the ground electrode is separated from the fixed electrode along the first axis by a first spacing less than 30 mm when the ground electrode is disposed in the second position, and by a second spacing greater than 100 mm when the ground electrode is disposed in the first position.

12. The apparatus of claim 1, wherein a first beam current of the ion beam at the substrate when the ground electrode is in the second position is at least 50% greater than a second beam current of the ion beam at the substrate when the ground electrode is in the first position.

13. An ion implanter, comprising:
  an ion source to generate an ion beam for treating a substrate;
  an extraction electrode to extract the ion beam at an initial beam potential; and
  an adjustable accel/decel column configured to receive the ion beam and to adjust the initial beam potential, the adjustable accel/decel column comprising:
    a focus electrode configured to conduct the ion beam through a focus aperture and to apply a focus electrode potential to the ion beam; and
    a ground electrode assembly disposed downstream of the focus electrode, the ground electrode assembly comprising a base and a ground electrode configured to apply a ground electrode potential different than the focus electrode potential and configured to conduct the ion beam through a ground electrode aperture, the ground electrode being reversibly movable along a first axis with respect to the focus electrode between a first position and a second position, wherein a beam current of the ion beam at the substrate varies when the ground electrode moves between the first position and second position.

14. The ion implanter of claim 13, the adjustable accel/decel column further comprising a terminal electrode disposed upstream of the focus electrode and configured to conduct the ion beam through a terminal electrode aperture and to apply a terminal electrode potential to the ion beam.

15. The ion implanter of claim 13, further comprising a drive component configured to move the ground electrode between the first position and second position responsive to user input.

16. The ion implanter of claim 13, further comprising a plurality of support members affixed to the base, wherein the ground electrode further comprises a plurality of sleeves disposed around the plurality of support members, respectively, wherein the plurality of sleeves are slidably movable with respect to the plurality of support members along the first axis.

17. A method of manipulating an ion beam, comprising:
  generating the ion beam using an ion source;
  arranging a ground electrode of an adjustable accel/decel column at a first position;
  applying a first fixed electrode potential to the ion beam at a fixed electrode of the adjustable accel/decel column disposed adjacent to and upstream of the ground electrode when the ground electrode is disposed at the first position;
  applying a second fixed electrode potential less than the first fixed electrode potential to the ion beam at the fixed electrode; and
  responsive to user input in a drive component, moving the ground electrode to a second position, wherein the ground electrode and fixed electrode define a first spacing in the first position and a second spacing smaller than the first spacing in the second position.

18. The method of claim 17, wherein the ground electrode is configured to move continuously between the first and second positions, wherein the ground electrode is configured to stably operate at a plurality positions intermediate the first position and second position.

19. The method of claim 17, wherein the user input comprises selection of the second fixed electrode potential, wherein the drive component is configured to automatically move the ground electrode from the first position to the second position responsive to receipt of the second fixed electrode potential.

* * * * *